United States Patent [19]

Feuerstein et al.

[11] Patent Number: 4,627,989

[45] Date of Patent: Dec. 9, 1986

[54] METHOD AND SYSTEM FOR A VACUUM EVAPORATIVE DEPOSITION PROCESS

[75] Inventors: Albert Feuerstein, Neuberg; Gernot Thorn, Hanau am Main; Horst Ranke, Filderstadt, all of Fed. Rep. of Germany

[73] Assignee: Leybold Heraeus GmbH, Cologne, Fed. Rep. of Germany

[21] Appl. No.: 639,363

[22] Filed: Aug. 8, 1984

[30] Foreign Application Priority Data

Aug. 20, 1983 [DE] Fed. Rep. of Germany ....... 3330092

[51] Int. Cl.$^4$ ...................... C23C 13/04; C23C 13/08
[52] U.S. Cl. .................................. 427/10; 427/255.5;
118/663; 118/665; 118/667; 118/715; 118/726;
118/718
[58] Field of Search ............... 118/665, 663, 667, 715,
118/726, 718; 427/10, 255.5

[56] References Cited

U.S. PATENT DOCUMENTS

| | | | |
|---|---|---|---|
| 2,734,478 | 2/1956 | Reynolds et al. | 118/665 |
| 3,281,265 | 10/1966 | Cauley | 118/665 X |
| 3,602,190 | 8/1971 | Kral, Jr. et al. | 118/665 |
| 3,752,973 | 8/1973 | Thorn et al. | 328/14 X |
| 3,853,093 | 12/1974 | Baker et al. | 118/715 X |
| 4,230,739 | 10/1980 | Aichert et al. | 427/42 |
| 4,311,725 | 1/1982 | Holland | 427/10 |
| 4,358,473 | 11/1982 | DeBolt et al. | 427/255.5 X |

OTHER PUBLICATIONS

Vock et al., "Control of Electron Beam Melting Furnace Covering Both the Power Sources and the Microprocessor Aided Beam Performance, " *Proceedings of the Conference on Electron Beam Melting and Refining-State of the Art*, 1983, R. Bakish, Nov. 6-8, 1983, pp. 95-133.

*Primary Examiner*—Richard Bueker
*Attorney, Agent, or Firm*—Felfe & Lynch

[57] ABSTRACT

A method and system for a vacuum-evaporative film-deposition process displays bar charts of the local evaporation power of each vapor source in the process and the film thickness deposited thereby in spatial coordination on a single display screen.

5 Claims, 4 Drawing Figures

METHOD AND SYSTEM FOR A VACUUM EVAPORATIVE DEPOSITION PROCESS

BACKGROUND OF THE INVENTION

The invention relates to a method and system for vacuum-evaporative film deposition on a substrate.

As used herein, "local evaporation power" means the power locally applied for producing a vapor stream for vacuum-evaporative film deposition defined as the amount of power per unit area and unit time. In other words, it is the power density of the usually-electric power input. The "evaporation rate" means the amount of vapor released per unit time. It is generally proportional to the local evaporation power, allowance being made for losses due to heat radiation and heat conduction, particularly from cooling water in a water-cooled vaporizer crucible. The "vapor source" means, very broadly, a localized zone, generally a surface portion, of a vaporizer from which the local evaporation power produces a spatially-limited vapor stream.

Examples of elongated arrays of individually-controllable vapor sources to which the invention is applicable follow.

German patent No. 24 02 111 discloses an elongated, in-line array of vapor sources. It is a row of parallel vaporizer boats directly transversed by heating current and individually controllable with respect to power. Each vaporizer boat is a separate vapor source, and the local evaporation power is proportional to the heating power of each individual vaporizer boat. It is, of course, possible to arrange similarly a plurality of water-cooled vaporizer crucibles which are heated by respectively-associated electron guns.

Published German patent application DOS No. 28 12 285 and corresponding U.S. Pat. No. 4,230,739 disclose a plurality of vapor sources from the surface of the content of a single vaporizer crucible by directing an electron beam in specific patterns onto the surface of the crucible content. One surface pattern consists of individual fields arranged in a row. The area of each field and the dwell time of the electron beam on each field produce different local evaporation powers. From each of these fields or vapor sources, there emanates a spatially-defined vapor stream which condenses as a film on a substrate disposed or moving past the vapor sources at a higher level. Similar film deposition is obtained with the thermal vaporizers mentioned above.

As a rule, the vapor streams are nonhomogeneous, at least considering the individual vapor streams collectively, producing a corresponding film-condensation pattern on the substrate. When a substrate is fixedly disposed relative to the vapor sources, this results in spots with a deposited-film thickness different from that on the rest of the substrate. When the substrate normally traverses the axis of the elongated vaporizer array, a markedly nonhomogeneous collective vapor stream may even produce a so-called "stripe pattern" which is totally unsuited for many applications. For example, in coating a continuous strip or foil wound at a right angle to an in-line array of vapor sources with an electrically-conducting film, locally-varying surface resistivities result or, in coating large-size glass sheets for glazing buildings with an optically-active film, optically objectionable transmittance or reflectance characteristics result.

The nonhomogeneity of the vapor streams is due not only to unintentional differences in the adjustment of the local evaporation powers, but also to variations attributable to geometric factors. For example, thermal vaporizers at the end of an in-line array are subject to heat losses in three directions; whereas, in the center, heat losses can occur only in two directions. Also, as a result of the overlapping of adjacent vapor streams, known as vapor lobes, toward the center of an in-line array, the rates of deposition there are higher than from elsewhere along the array. This effect might be compensated for by using an in-line array of a length considerably greater than the width of the substrate to be vapor coated, but this would entail corresponding losses of vapor material as well as fouling of the system through vapor deposition on its wall surfaces instead of the substrate to be coated.

The above relationships and steps to be taken to compensate for their effects in coating a continuous-strip substrate are described very graphically in U.S. Pat. No. 3,432,355. The film-thickness distribution perpendicular to the direction of deposition motion of a material substrate has, therefore, not been left to chance.

For example, German design patent No. 1,978,459 further discloses continuously monitoring the film-thickness distribution visually by placing a fluorescent lamp downstream of vapor deposition of an optical film on a moving foil. When the film thickness varies, the local evaporation power of an in-line vaporizer can be appropriately adjusted where the transmittance is too high or too low until a uniform film-thickness distribution is obtained, at least so far as can be determined visually.

This approach, however, is only suitable with optically-transmitting films and not with optically-opaque films such as, for example, metal coatings of appreciable thickness. Besides, the measurement and control attainable are not accurate enough to satisfy present-day film-thickness uniformity requirements.

SUMMARY OF THE INVENTION

An object of the invention thus is to provide a method and system which permits or control (manual or automatic) of the film-thickness distribution within tolerances that may be as close as practically desired, regardless of the transparency of the end product.

To these and other ends, the invention determines the local evaporation power of each vacuum-evaporative vapor source and the thickness of a film vapor deposited on a substrate thereby. The determined local evaporation power and film thickness values are displayed as spatially-coordinated bars of charts thereof on a single display screen. At least the film-thickness bar chart is calibrated on the display at least relatively. The local evaporation power is then adjusted appropriately to the vapor source, generally oppositely, to correct any deviation shown by any bar of the film-thickness bar chart from a film thickness desired relative to the calibration thereof.

The film-thickness bar chart graphically shows any deviation of film thickness over time on a stationary substrate or along a substrate moving past the vapor source. When the vapor source is an elongated array of vapor sources across which the substrate moves transversely, applying the method to each vapor source allows corresponding rows of film-thickness and local evaporation power bars in bar charts. Relative calibration of the film thickness can then be, for example, a desired film-thickness profile.

Tremendous versitility is a hallmark of the invention along with rigorous control. A sensor for each vapor source appropriate to the film it deposits and the desired precision of the film thickness control cooperate with spatial coordination of the bar-chart display of both the controlled film thickness and the local evaporation power by which it is controlled.

The invention is not limited to film thickness measurement signals obtained optically (transmittance and/or reflectance measurement); although, such measurement is appropriate to some thicknesses of certain coatings. Other film-thickness measuring techniques, such as capacitive or inductive measurement of surface resistivities, may also be used. Inductive measuring methods are preferred for thick or optically "dense" films; capacitive measuring methods are preferred for thin, highly-resistive films which are difficult to measure optically. Thus, a measuring method should be selected for suiting a coating and/or coated film thickness.

Displaying the local evaporation powers to an array of vapor sources gives a rough approximation of the distribution of the local vapor-stream density. For example, the influence of heat losses at the ends of the in-line array referred to earlier can be compensated for by coarse, relative power presetting based on values determined empirically even before film coating.

The second bar chart directly represents, with the accuracy of the sensing devices, the film-thickness distribution. Close spacing of the individual vapor sources is as desirable as close spacing of the individual measuring devices. Ideally, each individual vapor source should be followed by a sensing device in the direction of motion of the strip material.

Now, when an undesired film-thickness distribution or profile develops, the bar or bars of the first bar chart for the power input corresponding to the bar or bars of the second bar chart for the film-thickness values showing the undesired profile is or are selectively varied so that the second bar chart for the film-thickness distribution corresponds to the desired film-thickness profile. The spatial coordination of the bar charts makes this possible. Side by side coordination of the bar or bars of the two charts is possible, but as multiple bars for respective vapor sources and film-thickness sensors are preferred, verticle coordination of respective bar charts is preferred. Then, controlling the power input to the individual vapor sources identified on the first bar chart will suffice to reduce or increase the corresponding film-thickness values until the associated bars of the second chart which are spatially coordinated below or above them reach the desired level of actual, sensed film-thickness. The desired level may be preset, for example, through a line parallel to the abscissa of the second bar chart, or through two lines which enclose a tolerance range of film thicknesses, when a uniform film-thickness profile is desired. Selective variation of the local-evaporation-power values represented by each bar of the first bar chart thus selectively modifies the film thickness so that, starting from the abscissa, all bars of the second film-thickness bar chart have the same length, thus indicating an absolutely uniform film-thickness distribution.

If the first bar chart for the power input is stepped, this will be no cause for concern, in general, because uniform conditions of evaporation are less important than uniform conditions in the condensation from the vapor stream into the film. As a rule, however, above-average deviations within the first bar chart for the local evaporation power input indicate a disturbance in a vapor source. This may be due to insufficient material feed with automatic charging of a vaporizer, for example, or to the formation of slag patches on molten evaporation material. In such cases, even a marked increase in local evaporation power input would not produce a corresponding increase in the rate of condensation but might well result in damage to or destruction of the vapor source. Here, too, comparison of the two bar charts and the absolute level of the local evaporation power chart-bars will give a very good picture of the operating condition and operating behavior of the individual vapor sources to reduce this risk.

The invention further relates to an apparatus or system for carrying out the method. When a substrate is arranged to move perpendicularly to the longitudinal axis of an elongated array of vapor sources with an arrangement for individually controlling the local evaporation power of each vapor source and a film-thickness sensor is disposed downstream of each vapor source in the direction of substrate travel, the system comprises a way of indicating the film-thickness measurements of each sensor and the corresponding local evaporation power of the vapor source associated with each sensor as spatially-coordinated bar charts. Such a system may be characterized by (a) a display console; (b) a computer having desired-value memories for storing and outputting the adjustable desired values for at least one controller for the vapor sources, an arrangement for converting the desired values into video signals for the display as the first bar chart on the display console, and an arrangement for converting the film-thickness measurements into video signals for the display of as second bar chart on the same display console; and (c) an input unit for entering and adjusting the desired values into the memories.

BRIEF DESCRIPTION OF THE DRAWINGS

Preferred embodiments which are intended to illustrate but not to limit the invention will now be described in greater detail with reference to drawings, in which.

DESCRIPTION OF PREFERRED EMBODIMENTS

Figure 1:
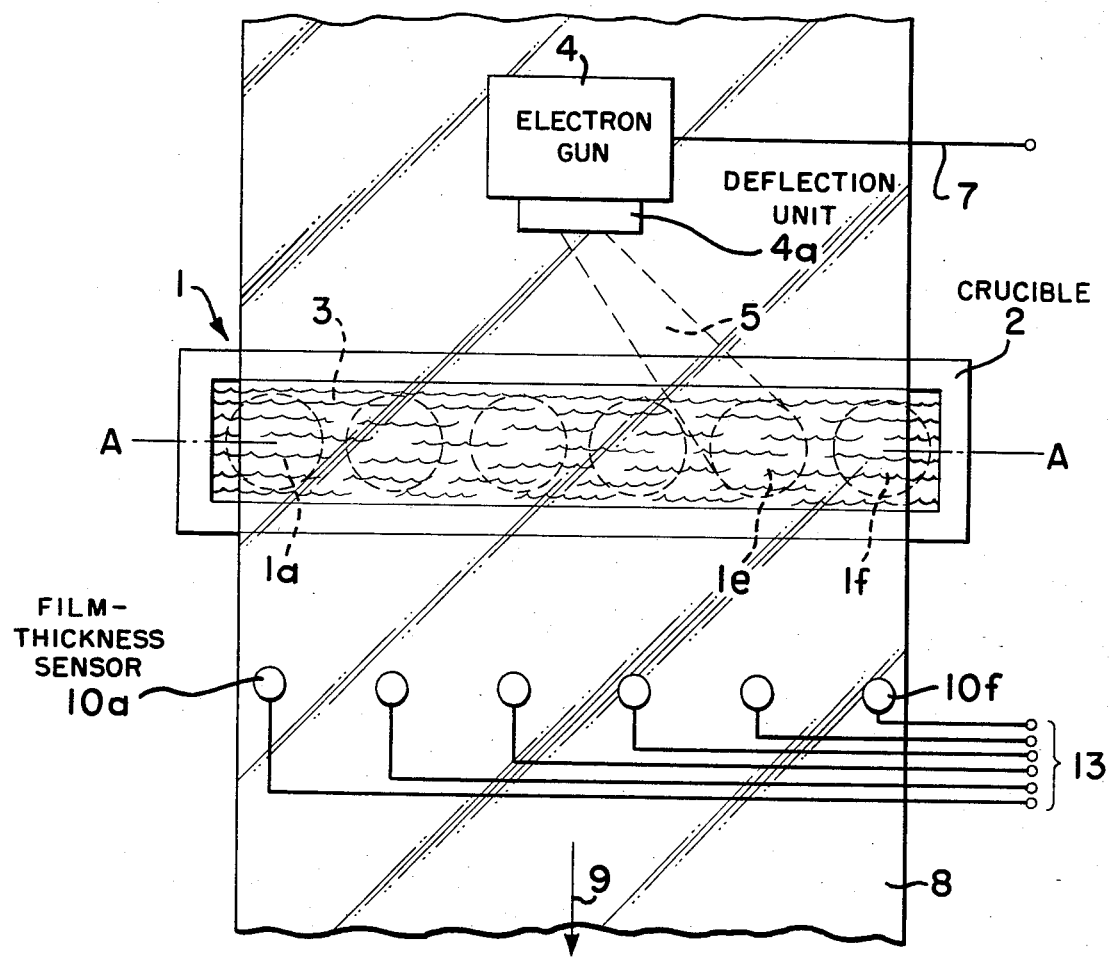
FIG. 1 is a bottom view of film-deposition apparatus with a film-thickness sensor portion of one preferred embodiment.

Shown in FIG. 1 is an elongated array 1 of a plurality of individually-controllable vapor sources 1a to 1f. The vapor sources 1a to 1f are shown in phantom because, as described above and below, they are zones on the surface of a rectangular, open-topped vaporizer crucible 2 holding molten evaporation material 3 shown from the bottom, through the crucible 2. The vaporizer crucible has a major or longitudinal axis A—A.

The evaporation material 3 is heated by an electron gun 4 which is mounted on a support (not shown) to the side of the vaporizer crucible 2, halfway along its axis A—A, and above its open top. The electron gun 4 has a deflection unit 4a whereby the electron beam 5 from the gun can be raster scanned in predetermined focusing patterns alternatively onto the individual vapor sources 1a to 1f, thus defining the latter. Here, the electron beam 5 impinges on the vapor source 1e.

The positions and areas of the vapor sources 1a to 1f are determined by the beam parameters and are not tied to any structural features of the vaporizer crucible 2. In the present case, the individual vapor sources are shown as distributed equidistantly over the total length of the vaporizer crucible 2 and of equal area size. The local evaporation power input (including the power density) will then be the same for each vapor source, assuming equal times of dwell on each vapor source.

It is therefore possible to apply more or less local evaporation power to a given vapor source over a time average by varying relative times of electron beam dwell on the individual vapor sources to control the vapor release per unit time (the evaporation rate) accordingly. The two vapor sources 1a and 1f at the ends of the vaporizer crucible 2, in particular, require more local evaporation power to compensate for the heat transfer to the crucible which, there only, is three sided and thus greater. It should be noted that, even though the electron beam scans the vapor sources, vapor is released practically continuously because the evaporation material 3 naturally exhibits a certain thermal inertia. Moreover, the beam scans at such a rapid rate that no appreciable cooling can occur between passes.

Figure 3:
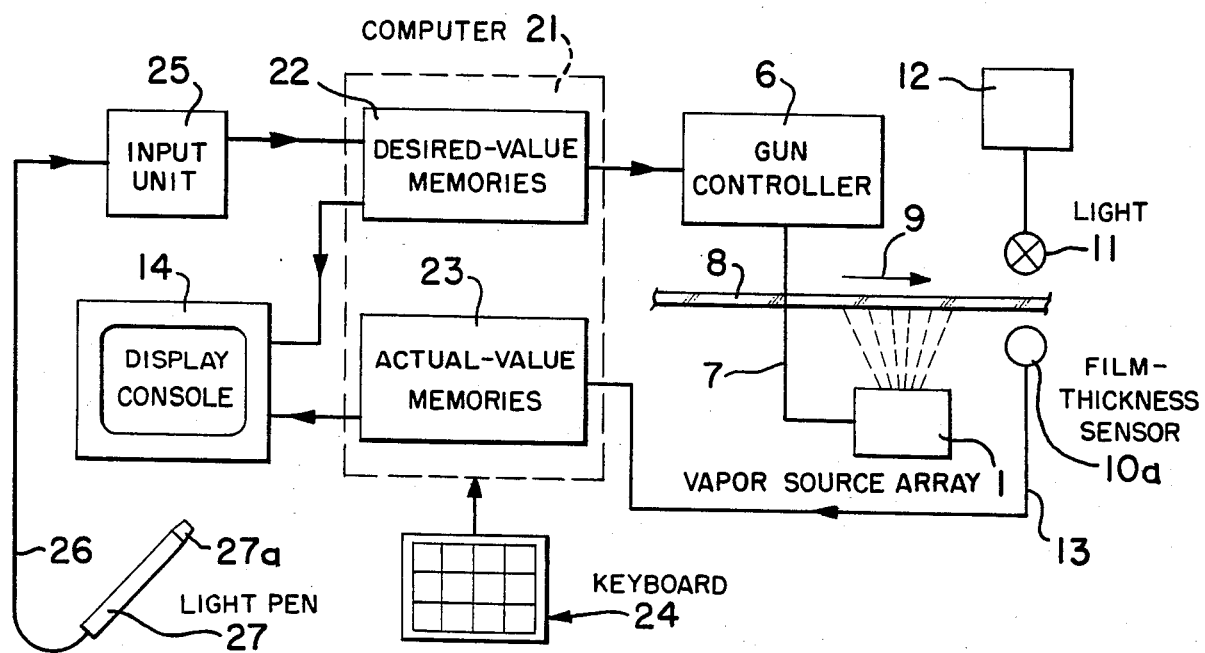
FIG. 3 is a schematic diagram of the embodiment shown partly in FIG. 2.
Figure 4:
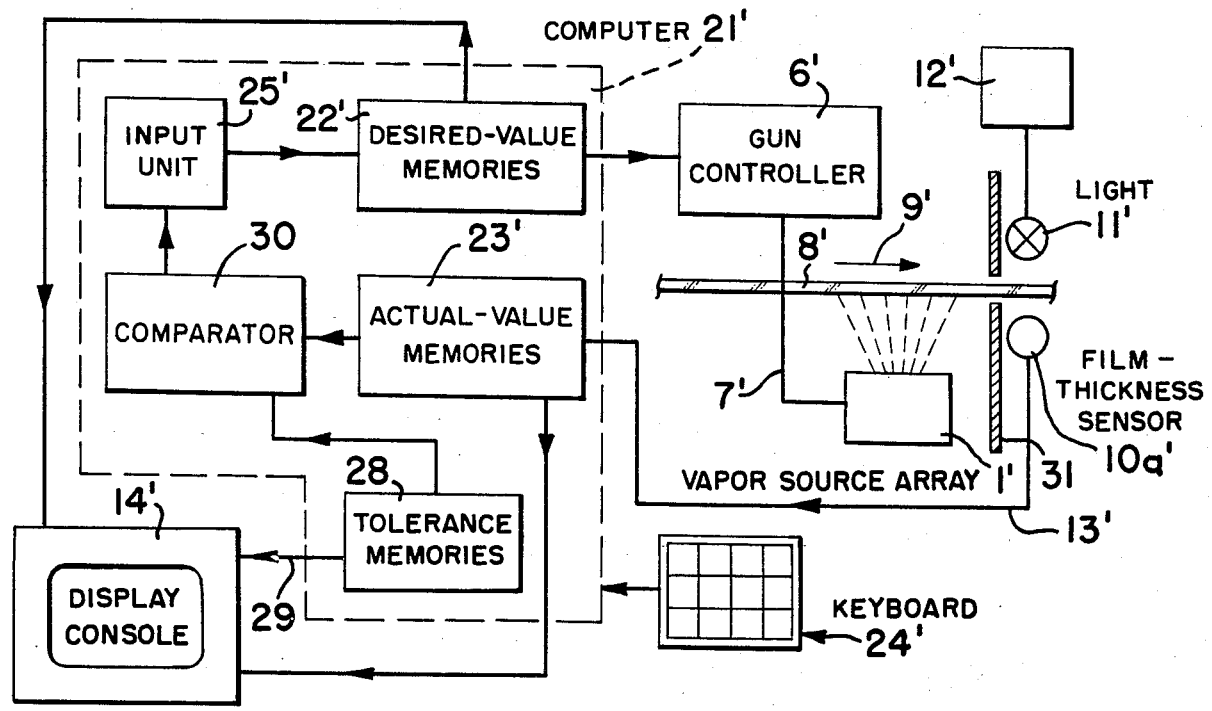
FIG. 4 is a schematic diagram of another preferred embodiment.

Both the electron gun 4 and the deflection unit 4a receive their power and the control commands for the beam deflection from a controller 6, 6' shown in FIGS. 3 and 4. It furnishes all beam parameters, including the coordinates for beam deflection in the x and y directions, in the form of electric signals and therefore is connected to the electron gun 4 through a multiconductor cable 7. The deflection unit 4a receives its signals in the form of discrete signal levels which control the position of beam impingement on the material surface, i.e. the vapor sources 1a to 1f, in the manner shown in FIG. 1.

Such vaporizer arrays, including the electron gun 4 and their mode of operation are prior art, for which reason there is no need to describe them here in detail.

Disposed above the array 1 and gun 4 is the substrate 8 to be vapor-coated. It moves continuously at a uniform rate in the direction indicated by the arrow 9; in other words, the direction of travel of the substrate is at a right angle to the axis A—A of all the vapor sources in the crucible. Downstream of the vapor sources in the direction of substrate travel and associated with the substrate 8 are a number of sensors 10a and 10f corresponding to the number of vapor sources 1a to 1f for detecting the thickness of the film which condenses on the substrate as it normally traverses the vapor sources over a limited range across the substrate. The sensors are preferably parallel to the array axis A—A. Sensors using various physical measuring methods are on the market. It will therefore suffice to describe here, only by way of example, the method of optical transmittance measurement which is illustrated in some detail in FIGS. 1, 3 and 4 and in which each sensor 10a to 10f in the form of a photodiode is associated with a light source 11 disposed opposite it on the other side of the substrate 8 and supplied by a voltage-stabilized current source 12. The sensors are provided with their own sensing-signal leads which are combined into a multiconductor cable 13.

The substrate 8 may be a continuous foil, that is to say, a foil which is wound from a supply roll onto a takeup roll, or it may be a sheet of glass which is intended for the glazing of a building and is being vapor-coated with an infrared-reflecting film, for example. Especially in the case of such films or coating systems, it is important to secure as uniform a film-thickness distribution as possible. Otherwise, there will be an impression of clouds or stripes after the pane has been installed in the building.

In a multiple-layer, vapor-deposition coating system (not shown), several arrays according to FIG. 1 may be arranged successively in the direction of substrate travel (arrow 9 in FIG. 1). In this case, an in-line arrangement of sensors is preferably provided for monitoring each individual vaporizer array.

All elements shown in FIG. 1 are enclosed in an appropriately-dimensioned vacuum chamber which, for the sake of simplicity, is not shown.

The number of vapor sources can be considerably increased without increasing the length of the vaporizer crucible by appropriate modification of the electron beam focusing and deflection patterns. For example, 12 (FIG. 2) or 18 vapor sources, or any other number, may be generated within the vaporizer crucible, the controllability of the film-thickness distribution being facilitated as the number of vapor sources is increased, though at the expense of greater complexity.

Figure 2:
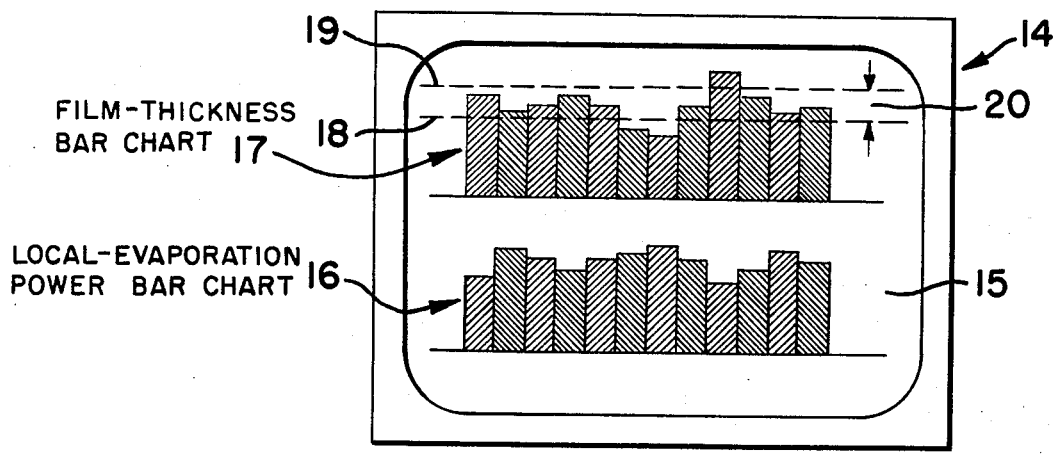
FIG. 2 is an elevation of a display portion of another preferred embodiment.

FIG. 2 is an elevation of a display console 14 with a cathode-ray tube (television picture tube) 15. On the screen, there is displayed a first bar chart 16 wherein the lengths of the bars (in the vertical direction) correspond to the local evaporation power input to each individual vapor source. Spatially-coordinated above it is a second bar chart 17 with bars corresponding to those of bar chart 16. The lengths of the bars of chart 17 correspond to the thickness of the film desposited by each vapor source as measured by its associated sensor. The display corresponds (by way of an expansion of FIG. 1) to an in-line array of a total of twelve vapor sources and twelve sensors. Over the area of the bar chart 17, two tolerance limits 18 and 19 are displayed in the form of horizontal lines to enclose a film-thickness tolerance range 20. This tolerance zone represents the minimum and maximum permissible film thicknesses. In the present case, a transmittance measurement according to FIGS. 3 and 4 has been used, that is to say, the measurement signal will be the smaller the thicker the vapor-deposited film is. It is apparent that the sixth and seventh bars from the left indicate an excessive film thickness and the ninth an insufficient film thickness. This operating condition therefore must be corrected at the associated vapor sources involved. From the bar chart 16, it is apparent that the spatially-coordinated, sixth and seventh bars indicate an excessive power input and the ninth an insufficient power input. In the case of bar chart 16, the power input is represented by the desired values for the particular evaporation power.

To equalize the highly nonuniform film-thickness distribution according to bar chart 17, the desired values according to bar chart 16 must be adjusted in the places concerned. In the present case, the desired values corresponding to bars sixth and seventh are decreased, as a result of which the amount of vapor released per unit time is reduced, and with it the film thickness in the area covered by these vapor sources. The sixth and seventh bars conversely, in bar chart 17 consequently are lengthened accordingly. Conversely, the local evaporation power represented by the ninth bar in bar chart 16 is increased so that the film thickness is increased and the transmittance reduced. The ninth bar in bar chart 17 thus is shortened to be within the tolerance range 20. In view of the sensitivity of control, it is clear that the tolerance limits 18 and 19 can also be placed close together to narrow the tolerance range 20, so that a highly uniform film-thickness profile is obtainable.

In FIG. 3, for simplicity, the electron gun 4 has been omitted, and the controller 6 is connected through the multiconductor cable 7 directly to the vaporizer array 1. Alternatively, an inline array of thermal vaporizers may be used. The vapor stream rising in the direction of the substrate 8 is indicated by dashed lines.

FIG. 3 further illustrates the following: A computer 21 is provided with desired-value memories 22 and actual-value memories 23 as well as with a keyboard 24 for entering data and computing programs and for initiating arithmetic operations, including modification of the screen displays. The desired-value memories 22 are preceded by an input unit 25 for entering and adjusting the desired values. Reduced to simple terms, it is an adjustable desired-value selector. The desired values are stored in the desired-value memories 22, cyclically scanned, and fed to the gun controller 6, which, in turn, controls the power distribution to the individual vapor sources, as explained above.

In the electron-beam vaporizer according to FIG. 1, for example, only the times of dwell would be varied, the length of the bars in the local-evaporation-power bar chart 16 being a direct measure of a given time of dwell. The controller 6 may, of course, also be made to control all beam parameters, such as beam current, voltage, focusing and deflection. Appropriate preset values can be entered by means of the keyboard 24. The sensors 10a and 10f similarly transmit the measurements (from transmittance measurement) through a multiconductor cable 13 to the actual-value memories 23.

After being converted into appropriate video signals, including an address code for the spacially-coordinated bar placement on the display screen, the contents of the desired-value and actual-value memories are fed to the screen, where they are displayed as shown in FIG. 2. Now when an impermissible deviation is observed in the upper bar chart 17, a desired-value adjustment is made by means of the input unit 25, following which a corresponding change will be observable within an extremely short time interval in the bar chart 16.

Computers of the type illustrated in FIG. 3 are on the market, and their circuitry and hookup with peripheral devices will be obvious to those skilled in the art on the basis of the foregoing explanations.

FIG. 3 shows a further possibility of controlling the input unit 25 in a particularly simple way. To this end, the input unit 25 is connected by means of a flexible cord 26 to a so-called light pen 27, which is also on the market. Such a light pen is provided at its tip with a photosensor 27a whereby light-dark transitions can be detected. The circuitry is such that the light pen functions as follows: When it is led over the upper edge of a bar of the bar chart 16 for the local-evaporation-power distribution, the light pen 27 shifts the light-dark boundary at the upper edge of that bar via the desired value in memory 22 and thus, lag free, the corresponding local evaporation power from array 1. Optically the impression is created that the light pen extends or compresses the bar. The associated bar in the bar chart 17 representing the film-thickness distribution then undergoes a corresponding shortening or lengthening. The light-pen 27 is synchronized with the video signals of the bar display console 14 so that only the bar the light-dark boundary of which the light pen is in direct optical contact with can be shifted.

In the embodiment shown in FIG. 3, the control loop thus is closed by an operator and, more particularly, by manual manipulation of the light pen 27.

In FIG. 4, the computer 21' is further provided with tolerance memories 28 in which an upper and lower tolerance valve may be stored for each bar of film-thickness bar chart 17 as shown or both charts. These tolerances are fed through a line 29 to the display console 14 and there displayed as tolerance limits 18 and 19 which, together, define tolerance range 20 (FIG. 2). However, the tolerances are further fed to a comparitor 30 in which they are compared with the individual actual values in the actual-value memory 23'. When they are above or below the tolerance limits, the comparitor 30 transmits a signal to the input unit 25' instructing it to increase or decrease the associated desired value for the controller 6' so that the local evaporation rate is corrected accordingly and the associated actual value is returned or reserved to the tolerance zone.

In the case of FIG. 4, the control loop is closed by the comparitor 30, and a given film-thickness distribution can be corrected at an extremely high speed which, in practice, is a function of only the transient response of the vaporizer array, the rate of substrate travel, and the spacing of the sensors 10 from the vaporizer array. From this it follows that the sensors should be placed as close as possible to the vaporizer array, although a safe distance should be maintained with due regard to thermal stresses on the one hand and to the risk of fouling with vapor on the other hand. If indicated, a shield 31 (FIG. 4) should be placed between the vaporizer array 1 and the sensors 10.

In apparatus for multiple-layer coatings and with a plurality of in-line vaporizers, either several display consoles may be provided or the screen display may be sanningly switched from one to another. The latter option is preferably adopted in an automated version so the control can continue independently of the display.

It will be appreciated that the instant specification and claims are set forth by way of illustration and not of limitation, and that various changes and modifications may be made without departing from the spirit and scope of the present invention.

What is claimed is:

1. A method for a vacuum evaporative deposition process in which the local evaporation power of a vapor source is adjustable to control the evaporation rate from the vapor source for controlling the thickness of a film deposited on a substrate by the vapor evaporated from the vapor source, comprising:
   determining the local evaporation power of each vapor source and the thickness of the film deposited on the substrate by each vapor source;
   displaying the determined local evaporation power and film thickness as spatially-coordinated bars of charts thereof on a single display screen, at least the film-thickness bar chart being at least relatively calibrated on the display screen; and
   adjusting the local evaporation power of any vapor source to correct any deviation of any bar of the film-thickness bar chart from a film thickness desired relative to the calibration thereof.

2. A system for a vacuum evaporative deposition process in which the local evaporation power of a vapor source is adjustable to control the evaporation rate from the vapor source for controlling the thickness of a film deposited on a substrate by the vapor evaporated from the vapor source, comprising:

means for determining the local evaporation power of each vapor source and the thickness of the film deposited on the substrate by each vapor source;

means for displaying the determined local evaporation power and film thickness as spatially-coordinated bars of charts thereof on a single display screen, at least the film-thickness bar chart being at least relatively calibrated on the display screen; and means for adjusting the local evaporation power of any vapor source to correct any deviation of any bar of the film-thickness bar chart from a film thickness desired relative to the calibration thereof.

3. The system of claim 2, wherein the means for adjusting the local evaporation power comprises a light pen and means operatively associating it with each bar of the local evaporation power and each respective vapor source for controlling the former in dependence upon the movement of the light pen relative to the bar.

4. The system of claim 2, wherein the means for adjusting the local evaporation power comprises a tolerance memory storing an upper and lower tolerance for each bar of the film-thickness bar chart and means adjusting the local evaporation power for reversing any deviation therefrom.

5. A system for a vacuum evaporative deposition process, comprising, in combination:

an elongated array of vapor sources in which the local evaporation power of each vapor source is adjustable to control the evaporation rate from each vapor source for controlling the thickness of a film deposited on a substrate by the vapor evaporated from each vapor source;

means for determining the local evaporation power of each vapor source and the thickness of the film deposited on the substrate by each vapor source;

means for displaying the determined local evaporation power and film thickness as spatially-coordinated bars of charts thereof on a single display screen, at least the film-thickness bar chart being at least relatively calibrated on the display screen; and means for adjusting the local evaporation power of any vapor source to correct any deviation of any bar of the film-thickness bar chart from a film thickness desired relative to the calibration thereof.

* * * * *